(12) United States Patent
Scholtens

(10) Patent No.: US 7,002,502 B2
(45) Date of Patent: Feb. 21, 2006

(54) ANALOG-TO-DIGITAL CONVERTER AND METHOD OF GENERATING AN INTERMEDIATE CODE FOR AN ANALOG-TO-DIGITAL CONVERTER

(75) Inventor: Peter Cornelis Simeon Scholtens, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/498,765

(22) PCT Filed: Dec. 12, 2002

(86) PCT No.: PCT/IB02/05406

§ 371 (c)(1),
(2), (4) Date: Jun. 15, 2004

(87) PCT Pub. No.: WO03/055076

PCT Pub. Date: Jul. 3, 2003

(65) Prior Publication Data

US 2005/0146455 A1 Jul. 7, 2005

(30) Foreign Application Priority Data

Dec. 20, 2001 (EP) .................................. 01205046

(51) Int. Cl.
*H03M 1/36* (2006.01)

(52) U.S. Cl. ....................................... 341/160; 341/159

(58) Field of Classification Search ................ 341/155, 341/159, 118, 120, 160
See application file for complete search history.

(56) References Cited

U.S. PATENT DOCUMENTS

| | | | |
|---|---|---|---|
| 4,733,220 A * | 3/1988 | Knierim ....................... 341/64 |
| 5,329,279 A * | 7/1994 | Barbu et al. .................. 341/50 |
| 5,525,985 A * | 6/1996 | Schlotterer et al. ......... 341/136 |
| 6,268,819 B1 * | 7/2001 | Fattaruso et al. ........... 341/154 |
| 6,542,104 B1 * | 4/2003 | Capofreddi ................. 341/160 |
| 6,774,830 B1 * | 8/2004 | Brooks ....................... 341/131 |
| 6,906,656 B1 * | 6/2005 | Yoon .......................... 341/158 |

* cited by examiner

*Primary Examiner*—Linh Van Nguyen

(57) ABSTRACT

Analog-to-digital converter for converting an analog input signal into a digital binary output signal includes a reference unit for generating a thermometric signal based on comparison of the input signal with a reference voltage level, a first logic circuit connected to the reference unit for generating an intermediate signal based on the thermometric signal, and a second logic circuit connected to the first logic circuit for generating the digital binary output signal based on the intermediate signal. The thermometric signal includes a bit word from a first set of bit words and the intermediate signal includes a bit word from a second set of bit words. Bit words from the second set are arranged in rows of a matrix, the sequence of the rows corresponding to unique numbers represented by the bit words. Respective numbers of bit changes in the respective columns of the matrix are at least substantially equal.

20 Claims, 4 Drawing Sheets

| Measuring Signal Code | Gray Code | S Code | Binary Code | Unique Value |
|---|---|---|---|---|
| $T_{15}T_{14}T_{13}T_{12}T_{11}T_{10}T_9T_8T_7T_6T_5T_4T_3T_2T_1$ | $G_1G_2G_3G_4$ | $S_1S_2S_3S_4$ | $B_1B_2B_3B_4$ | |
| 0 0 0 0 0 0 0 0 0 0 0 0 0 0 0 | 0 0 0 0 | 0 0 0 0 | 0 0 0 0 | 0 |
| 0 0 0 0 0 0 0 0 0 0 0 0 0 0 1 | 0 0 0 1 | 0 0 0 1 | 0 0 0 1 | 1 |
| 0 0 0 0 0 0 0 0 0 0 0 0 0 1 1 | 0 0 1 1 | 0 0 1 1 | 0 0 1 0 | 2 |
| 0 0 0 0 0 0 0 0 0 0 0 0 1 1 1 | 0 0 1 0 | 0 0 1 0 | 0 0 1 1 | 3 |
| 0 0 0 0 0 0 0 0 0 0 0 1 1 1 1 | 0 1 1 0 | 0 1 1 0 | 0 1 0 0 | 4 |
| 0 0 0 0 0 0 0 0 0 0 1 1 1 1 1 | 0 1 1 1 | 0 1 0 0 | 0 1 0 1 | 5 |
| 0 0 0 0 0 0 0 0 0 1 1 1 1 1 1 | 0 1 0 1 | 1 1 0 0 | 0 1 1 0 | 6 |
| 0 0 0 0 0 0 0 0 1 1 1 1 1 1 1 | 0 1 0 0 | 1 1 1 0 | 0 1 1 1 | 7 |
| 0 0 0 0 0 0 0 1 1 1 1 1 1 1 1 | 1 1 0 0 | 1 0 1 0 | 1 0 0 0 | 8 |
| 0 0 0 0 0 0 1 1 1 1 1 1 1 1 1 | 1 1 0 1 | 1 0 1 1 | 1 0 0 1 | 9 |
| 0 0 0 0 0 1 1 1 1 1 1 1 1 1 1 | 1 1 1 1 | 1 1 1 1 | 1 0 1 0 | A |
| 0 0 0 0 1 1 1 1 1 1 1 1 1 1 1 | 1 1 1 0 | 0 1 1 1 | 1 0 1 1 | B |
| 0 0 0 1 1 1 1 1 1 1 1 1 1 1 1 | 1 0 1 0 | 0 1 0 1 | 1 1 0 0 | C |
| 0 0 1 1 1 1 1 1 1 1 1 1 1 1 1 | 1 0 1 1 | 1 1 0 1 | 1 1 0 1 | D |
| 0 1 1 1 1 1 1 1 1 1 1 1 1 1 1 | 1 0 0 1 | 1 0 0 1 | 1 1 1 0 | E |
| 1 1 1 1 1 1 1 1 1 1 1 1 1 1 1 | 1 0 0 0 | 1 0 0 0 | 1 1 1 1 | F |
| Number of Bit Changes | 1 2 4 8 | 3 4 4 4 | 1 2 4 6 | |

| Measuring Signal Code T15 T14 T13 T12 T11 T10 T9 T8 T7 T6 T5 T4 T3 T2 T1 | Gray Code G1 G2 G3 G4 | S Code S1 S2 S3 S4 | Binary Code B1 B2 B3 B4 | Unique Value |
|---|---|---|---|---|
| 0 0 0 0 0 0 0 0 0 0 0 0 0 0 0 | 0 0 0 0 | 0 0 0 0 | 0 0 0 0 | 0 |
| 0 0 0 0 0 0 0 0 0 0 0 0 0 0 1 | 0 0 0 1 | 0 0 0 1 | 0 0 0 1 | 1 |
| 0 0 0 0 0 0 0 0 0 0 0 0 0 1 1 | 0 0 1 1 | 0 0 1 1 | 0 0 1 0 | 2 |
| 0 0 0 0 0 0 0 0 0 0 0 0 1 1 1 | 0 0 1 0 | 0 1 1 0 | 0 0 1 1 | 3 |
| 0 0 0 0 0 0 0 0 0 0 0 1 1 1 1 | 0 1 1 0 | 0 1 0 0 | 0 1 0 0 | 4 |
| 0 0 0 0 0 0 0 0 0 0 1 1 1 1 1 | 0 1 1 1 | 1 1 0 0 | 0 1 0 1 | 5 |
| 0 0 0 0 0 0 0 0 0 1 1 1 1 1 1 | 0 1 0 1 | 1 1 1 0 | 0 1 1 0 | 6 |
| 0 0 0 0 0 0 0 0 1 1 1 1 1 1 1 | 0 1 0 0 | 1 0 1 0 | 0 1 1 1 | 7 |
| 0 0 0 0 0 0 0 1 1 1 1 1 1 1 1 | 1 1 0 0 | 1 0 1 1 | 1 0 0 0 | 8 |
| 0 0 0 0 0 0 1 1 1 1 1 1 1 1 1 | 1 1 0 1 | 1 1 1 1 | 1 0 0 1 | 9 |
| 0 0 0 0 0 1 1 1 1 1 1 1 1 1 1 | 1 1 1 1 | 0 1 1 1 | 1 0 1 0 | A |
| 0 0 0 0 1 1 1 1 1 1 1 1 1 1 1 | 1 1 1 0 | 0 1 0 1 | 1 0 1 1 | B |
| 0 0 0 1 1 1 1 1 1 1 1 1 1 1 1 | 1 0 1 0 | 1 1 0 1 | 1 1 0 0 | C |
| 0 0 1 1 1 1 1 1 1 1 1 1 1 1 1 | 1 0 1 1 | 1 0 0 1 | 1 1 0 1 | D |
| 0 1 1 1 1 1 1 1 1 1 1 1 1 1 1 | 1 0 0 1 | 1 0 0 0 | 1 1 1 0 | E |
| 1 1 1 1 1 1 1 1 1 1 1 1 1 1 1 | 1 0 0 0 | 1 0 0 0 | 1 1 1 1 | F |
| Number of Bit Changes | 1 2 4 8 | 3 4 4 4 | 1 2 4 6 | |

FIG. 2

ANALOG-TO-DIGITAL CONVERTER AND METHOD OF GENERATING AN INTERMEDIATE CODE FOR AN ANALOG-TO-DIGITAL CONVERTER

This application is a 371 of PCT/IB02/05406 filed on Dec. 12, 2002.

The invention relates to an analog-to-digital converter for converting an analog input signal into a digital binary output signal, comprising a reference unit for generating a measuring signal based on a comparison of the input signal with a reference voltage, a first logic circuit connected to the reference unit for generating an intermediate signal based on the measuring signal, a second logic circuit connected to the first logic circuit for generating the digital binary output signal based on the intermediate signal, wherein the measuring signal comprises a bit word from a first set of bit words and the intermediate signal comprises a bit word from a second set of bit words, each bit word representing a unique value, and two bit words from the second set, which belong to two consecutive unique values, respectively, differing by no more than one bit, and wherein the bit words from the second set can be arranged in rows in a matrix, the order of the rows corresponding to the unique values represented by the bit words, while in operation each bit of the bit word of the measuring signal is applied to only one input port of the first logic circuit.

The invention further relates to a method of generating a code comprising a set of bit words, the method comprising at least the following steps:

defining a set of bit words, each bit word containing n bits, where n is an integer greater than one and where each bit word represents a unique value;

arranging the bit words into a set of nodes, each node representing one bit word.

Said analog-to-digital converter is known from practice. In the known analog-to-digital converter, the reference unit generates a measuring signal such as, for example, a thermometer signal which comprises a bit word from said first set. This first set is a measuring signal code. It holds for the bit words from the first set that a first part of the bit word consists of a sequence of zeros and that a second part consists of a sequence of ones. Based on the measuring signal the first logic circuit can generate an intermediate signal which consists of a bit word from the second set. This second set of bit words is an intermediate code known by the name of Gray code, and the intermediate signal based on this is the Gray signal. It holds for the Gray code that the bit words belonging to successive unique values differ from one another by only one bit. This achieves that a possible defect that may arise when the measuring signal is converted into the Gray signal, for example due to the undesired change of a bit value of the measuring signal, can amount to one unit of the unique value at the most. The Gray signal is finally converted into the digital binary output signal by the second logic circuit.

A disadvantage of the known analog-to-digital converter is that the first logic circuit has a relatively large logic depth (the logic depth being related to the maximum number of series-arranged processing elements in the circuit). In this respect it particularly holds that the logic depth for generating the least significant bit of the Gray code is considerably larger than the logic depth for generating the most significant bit of the Gray code. A consequence of this is that the most significant bit arrives at an output of the first logic circuit earlier than the least significant bit. In this way the conversion from the measuring signal code to the Gray code is limited by the waiting time for the least significant bit. This represents a limitation of the processing speed of the known analog-to-digital converter.

It is an object of the invention to provide an analog-to-digital converter that eliminates the aforesaid disadvantage. The analog-to-digital converter according to the invention is for this purpose characterized in that the respective numbers of bit changes in the respective columns of said matrix are substantially equal. For this purpose, an intermediate code, hereinafter to be referred to as S code, is used in the analog-to-digital converter according to the invention. The intermediate signal based on the S code will be referred to as S signal hereinafter. Various S codes are possible for the analog-to-digital converter according to the invention. These codes can be generated by the method according to the invention, as will be discussed in more detail below.

The logic depth of the first logic circuit of the analog-to-digital converter according to the invention is smaller than the logic depth of the first logic circuit of the known analog-to-digital converter. The result of this is that the intermediate signal in the analog-to-digital converter according to the invention can be delivered at the outputs more rapidly than is the case with the known analog-to-digital converter. Furthermore, it holds that the logic depth of the second logic circuit (for converting the S signal into the binary output signal) of the analog-to-digital converter according to the invention is not larger than the logic depth of the second logic circuit (for converting the Gray signal into the binary output signal) for the known analog-to-digital converter. This means that the speed gain of the first logic circuit according to the invention results in a faster analog-to-digital converter. As a result, the analog-to-digital converter according to the invention can sample input signals with a higher frequency than the known analog-to-digital converter.

In many cases the first logic circuit will comprise a number of sub-circuits, each sub-circuit generating one bit of the bit word of the intermediate signal. Since the respective numbers of bit variations in the respective columns of the matrix are at least substantially equal, the sub-circuits will at least substantially have the same logic depth.

A preferred embodiment of the analog-to-digital converter according to the invention is characterized in that the digital binary output signal contains n bits, where n>1 and where the number of bit changes in each column of said matrix is at least substantially equal to $$\frac{2^n}{n}.$$

The logic depth of the first logic circuit in this preferred embodiment is approximately equal to $$n - \frac{\ln(n)}{\ln(2)}.$$

In this respect it is observed that the logic depth of a first logic circuit for converting the measuring signal into the Gray signal is n−1. The advantage mentioned above of the analog-to-digital converter according to the invention, in respect of a higher processing speed, will therefore be greater for higher values of n.

The code generation method according to the invention is characterized in that the method also comprises the following steps:

making inter-node connections such that connections are only made between nodes of which the associated bit words differ by only one bit;

successively passing through nodes by various paths via the connections thus made, a matrix being drafted for each path, the bit words of the successive nodes being accommodated in the matrix in consecutive rows;

selecting a matrix from the matrices thus drafted whose respective numbers of bit changes in the respective columns of the matrix are at least substantially equal.

The consecutive rows of the selected matrix contain consecutive bit words of the S code. The S code thus found may be used for realizing an analog-to-digital converter according to the invention. As has already been observed hereinbefore, the number of bit variations is then at least substantially evenly spread over the columns of the matrix. As a result, the associated sub-circuits will all have substantially the same logic depth for the generation of the bits.

It preferably holds that in said method a computer is utilized to traverse all the nodes via said connections made and to select at least one matrix whose respective numbers of bit changes in the respective columns of the matrix are at least substantially equal.

BRIEF DESCRIPTION OF DRAWINGS

The invention will now be further discussed with reference to the drawing in which:

FIG. 2 shows a table having a column with a Thermometer code, a column with a Gray code, a column with an S code, a column with a binary code, and a column with unique values, the S code column comprising a four-column matrix;

FIG. 1 shows an analog-to-digital converter 2 for converting an analog input signal 4 into a digital binary output signal 6. The analog-to-digital converter 2 comprises a reference unit 8 for generating a measuring signal 10 based on a comparison of the input signal 4 with a reference voltage 12. The measuring signal is a bit word from a first set of bit words. This first set is also referred to as a measuring signal code. A highly suitable type of measuring signal is a so-termed thermometer signal.

Figure 1:
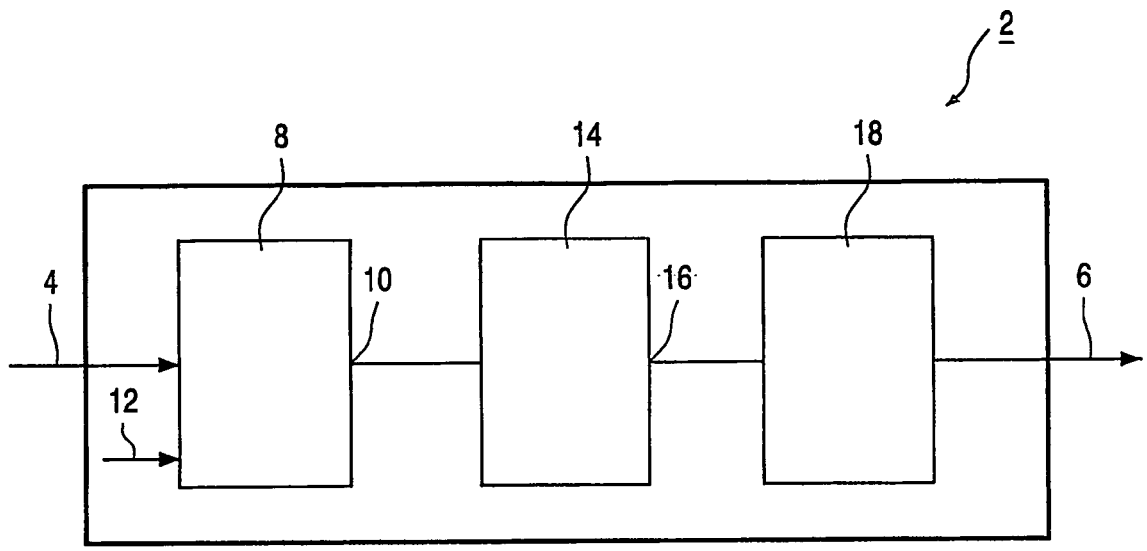
FIG. 1 is a diagram of an analog-to-digital converter according to the invention.

Furthermore, the analog-to-digital converter 2 comprises a first logic circuit 14 which is connected to the reference unit 8 for generating an intermediate signal 16 based on the measuring signal 10. The intermediate signal 16 is a bit word from a second set of bit words. This second set of bit words is called the intermediate code. Each bit word from the intermediate code represents a unique value, with two bit words belonging to successive unique values differing by only a single bit. The intermediate code mentioned above may be an S code, as will be further explained hereinafter. The analog-to-digital converter 2 further comprises a second logic circuit 18 which is connected to the first logic circuit 14 for generating the digital binary output signal 6 based on the intermediate signal 16. The binary output signal 6 comprises a bit word from a third set of bit words. This third set is often a binary code.

The Table in FIG. 2 comprises a matrix and gives a survey of a possible relationship between the aforesaid codes. In this example the digital binary output signal 6 comprises four bits (n=4). The Table shows a possible relationship between a measuring signal code, Gray code, and a binary code for a state of the art analog-to-digital converter. The table further shows a possible relationship between the measuring signal code, S code, and the binary code for an analog-to-digital converter 2 according to the invention. In this example the intermediate code (S code) consists of four bits. Alternatively it is possible for the intermediate code to have more than four bits so as to achieve a certain redundancy.

The first main column "Measuring Signal Code" of the Table shows the bit words of the measuring signal code. Each bit word of the measuring signal code is built up from the bits $T_{15}$ to $T_i$. The second main column "Gray Code" of the Table shows the Gray code. The Gray code comprises bit words comprising 4 bits $G_1$ to $G_4$ each. The Gray code is frequently used as an intermediate code in known analog-to-digital converters. The third main column "S Code" of the Table shows an S code which may be used as an intermediate code in an analog-to-digital converter according to the invention. The fourth main column "Binary Code" in the Table shows the binary code. This binary code is used for reproducing the digital binary output signal 6. Finally, the fifth main column in the Table ("Unique Values") shows by what path (via rows of the table) a unique value is coupled to each bit word of each code.

The following is a brief explanation of the operation of the analog-to-digital converter 2.

In the reference unit 8, the analog input signal 4 is compared with the reference voltage 12. For this purpose the reference unit 8 comprises a number of comparators (not shown in the drawing) in a manner known per se, each comparator having a first and a second input terminal. Each of the first input terminals is connected to the analog input signal 4. A unique voltage which is derived from said reference voltage is supplied to each of the second input terminals. Since the unique voltage is different for each comparator, it is possible to measure the analog input signal 4 with the various comparators and to generate a digital measuring signal 10 based on the comparisons. In this process, each comparator drives one bit of the measuring signal code in principle. With an increasing analog input signal 4, the measuring signal 10 will contain an increasing number of ones. The successive bit words of the measuring signal 10 in the Table of FIG. 2 show that the bit words of the measuring signal 4 can be compressed further. This is effected by a transformation from the thermometer signal 10 to a 4-bit intermediate signal. According to the invention, the 4-bit intermediate signal is an S signal (according to the state of the art, for example, a Gray signal). The transformation is performed by the first logic circuit 14.

Figure 3:
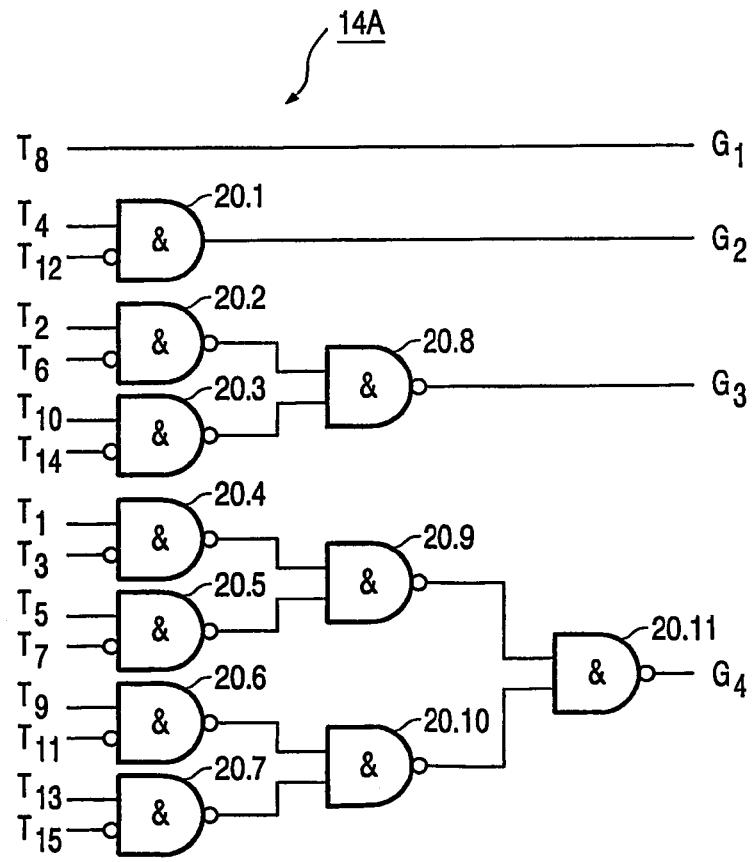
FIG. 3 is a diagram of a first logic circuit of an analog-to-digital converter according to the state of the art.

FIG. 3 gives an example of a first logic circuit 14A for an analog-to-digital converter according to the state of the art with (n=4). FIG. 3 shows on the left hand side by what paths the 15 bits $T_1$ to $T_{15}$ of the bit words of the measuring signal (see also the table in FIG. 2) are applied to the inputs of the first logic circuit. The first logic circuit comprises digital AND gates 20.1 to 20.11 known per se, each gate having two inputs and one output. Each of the AND gates 20.1 to 20.7 further has one input to which an inverter (negation element)

is connected. The inverters are schematically shown in circles. Furthermore, the AND gates 20.2 to 20.8 and 20.11 have an inverter at the output. FIG. 3 together with the Table of FIG. 2 show that the bits $G_1$ to $G_4$ of the Gray code are delivered at the outputs of the first logic circuit 14A. $G_1$ is then the most significant bit of the Gray code and $G_4$ the least significant bit of the Gray code.

The first logic circuit 14A comprises four sub-circuits, each sub-circuit generating a bit of the Gray code. This first sub-circuit for generating $G_1$ has a logic depth 0. This logic depth is determined by the maximum number of ports or processing elements connected in series. The second sub-circuit for generating $G_2$ has a logic depth 1, the third sub-circuit for generating $G_3$ has a logic depth 2, and the fourth sub-circuit for generating $G_4$ has a logic depth 3. The logic depth of the first logic circuit is equal to the maximum logic depth of the sub-circuits and in this case equal to 3 (=n−1).

Figure 4:
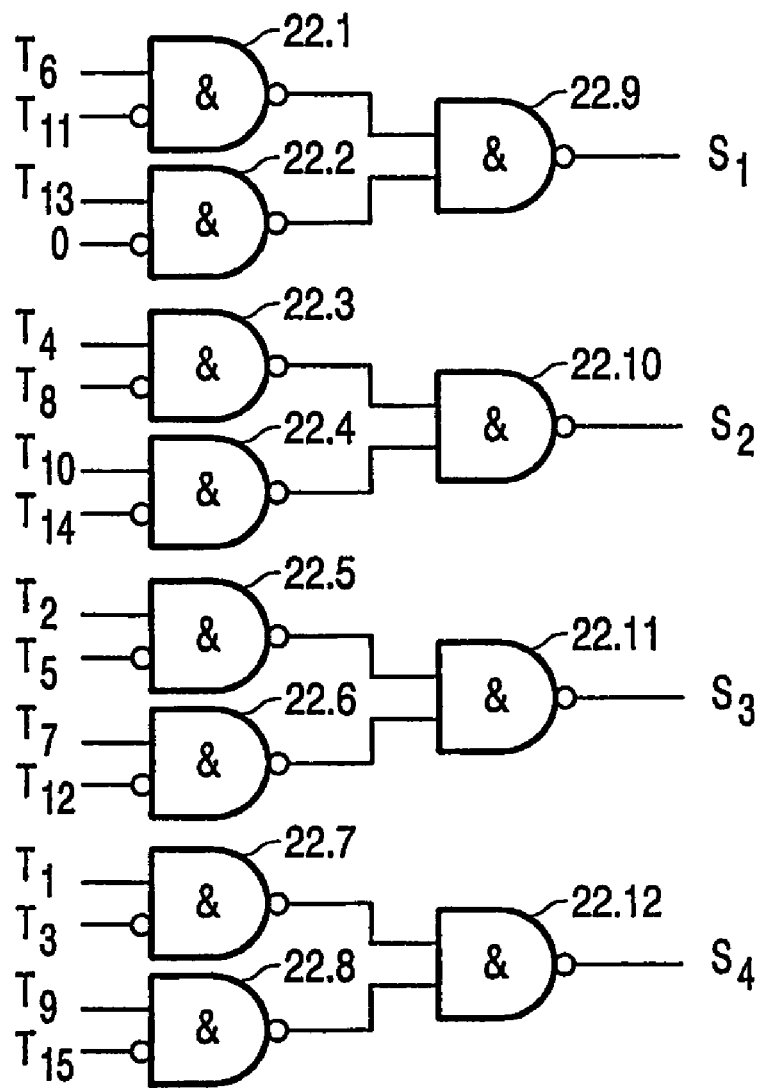
FIG. 4 is a diagram of a first logic circuit of an analog-to-digital converter according to the invention.

FIG. 4 schematically shows a first logic circuit 14B of an analog-to-digital converter 2 according to the invention for n=4. It shows on the left hand side the 15 input bits $T_1$ to $T_{15}$ of the thermometer signal and on the right hand side the 4 bits $S_1$ to $S_4$ of the S signal. The first logic circuit 14B comprises digital AND gates 22.1 to 22.12 known per se, each gate having two inputs and one output. Each of the AND gates 22.1 to 22.8 further has one input to which an inverter (negation element) is connected. Furthermore, each AND gate includes an inverter at the output. The inverters are schematically shown in circles.

The structure of the first logic circuit 14B is such that this circuit comprises four respective sub-circuits for generating the four respective bits of the S signal. The logic depths of the various sub-circuits are equal in this example. Each logic sub-circuit has a logic depth of $$2\left(=n-\frac{\ln(n)}{\ln(2)}\right).$$

The reason for the equal distribution of the logic depths over the sub-circuits can be traced back in the Table of FIG. 2. The column under "S code" in the table forms a matrix consisting of four columns and sixteen rows. This matrix shows that the number of times a bit changes its value per column (=number of bit variations) (in this case 3;4;4;4, respectively) is substantially equally distributed over the various columns of the matrix. The number of bit changes per column is approximately equal to $2^n/n$.

The consequence of the foregoing is that the bits of the intermediate signal are delivered substantially simultaneously at the outputs of the first logic circuit 14B. A further consequence is the small logic depth of the first logic circuit 14B, so that the intermediate signal 16 is available at the outputs of the first logic circuit 14 B. The consequence of this is that the analog-to-digital converter according to the invention has a high data processing rate and can thus sample input signals at a high frequency.

Concerning the first logic circuits 14A, 14B it is observed that each bit of the bit word of the measuring signal is applied to one and only one input port of the first logic circuits. This measure prevents situations that may lead to unnecessary erroneous conversions. An example of such a situation is when a bit is applied to two different ports and when, as a consequence of the changing of the bit value of the bit, different bit words are applied to the ports.

Figures 5, 6:
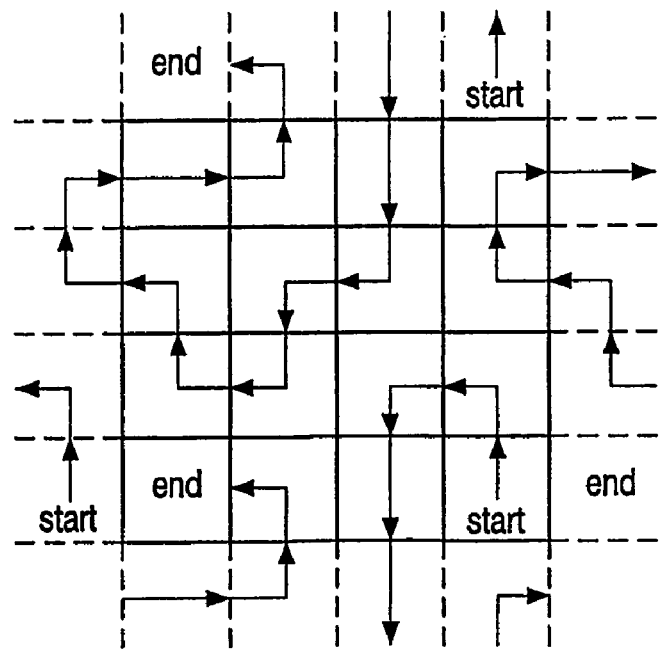
FIG. 5 is a diagram for illustrating a method according to the invention for generating an S code.
FIG. 6 is a further diagrammatic illustration of the method illustrated in FIG. 5.

FIGS. 5 and 6 illustrate a method of generating an S code. An S code may be used, for example, in an analog-to-digital converter according to the invention. When an S code is generated, first of all a set of bit words is defined, each bit word comprising n bits (n>1). In this example the set of bit words is derived from the Table in FIG. 2 (so in this case n=4). FIG. 5 shows a two-dimensional Karnaugh diagram in which the unique values (hexadecimal values) of a total of sixteen bit words with n=4 bits are subdivided into sixteen boxes or nodes. Each node of the diagram has exactly one unique value. Furthermore, every node of the diagram is connected to four adjacent nodes (boxes), so that the binary representations of the associated bit words differ by only 1 bit (see also the Table in FIG. 2). FIG. 5 shows, for example, that the node in which the unique 0 value occurs is connected to the nodes in which the unique values 4, 8, 1 and 2 occur (the diagram is cyclically repeated, see the dotted lines). The binary representation "0000"(=0) does indeed differ by only one bit from the representations "0100"(=4), "1000"(=8) "0001"(=1) and "0010"(=2). "0000"(=0) differs by at least two bits from the other representations. Now it is possible to pass through the diagram in FIG. 5 along different paths such that consecutive nodes are traversed through via the connections made. In this respect it is of importance that when partitions of neighboring nodes are passed, the linear representations belonging to the nodes differ by only 1 bit. An example of a possible way of passing through the nodes is given in FIG. 6. A matrix is made for each route through the nodes, the bit words of the consecutive nodes being accommodated in successive rows in the matrix. Subsequently, the matrix in which the respective numbers of bit changes in the respective columns are at least substantially equal can be selected from the matrices obtained. In this way an S code according to the invention is found.

In the method according to the invention, a computer may be used to traverse all the nodes by every possible path via said connections provided and to select at least one matrix whose respective numbers of bit variations in the respective columns are at least substantially equal.

The invention was described above with reference to a number of embodiments in which the intermediate code comprises four bits. However, the invention may be applied in a comparable manner to intermediate codes comprising bit words of more than four bits.

The invention claimed is:

1. An analog-to-digital converter for converting an analog input signal into a digital binary output signal, comprising:
 a reference unit for generating a measuring signal based on a comparison of the input signal with a reference voltage,
 a first logic circuit connected to the reference unit for generating an intermediate signal based on the measuring signal, and
 a second logic circuit connected to the first logic circuit for generating the digital binary output signal based on the intermediate signal,
 wherein the measuring signal comprises a bit word from a first set of bit words and the intermediate signal comprises a bit word from a second set of bit words, each bit word representing a unique value, and two bit words from the second set which belong to two consecutive unique values, respectively, differ by no more than one bit, and
 wherein the bit words from the second set are arranged in rows in a matrix in which the order of the rows corresponds to the unique values represented by the bit words, while in operation each bit of the bit word of the measuring signal is applied to only one input port of the first logic circuit, and wherein the respective numbers of bit changes in the respective columns of the matrix formed by the bit words of the second set are substantially equal.

2. An analog-to-digital converter as claimed in claim 1, wherein the digital binary output signal comprises n bits, where n>1, and where the number of bit changes in each column of the matrix formed by the bit words of the second set is substantially equal to $2^n/n$.

3. An analog-to-digital converter as claimed in claim 1, wherein the first logic circuit comprises a plurality of respective sub-circuits, each of the sub-circuits having an equal logic depth.

4. An analog-to-digital converter as claimed in claim 1, wherein the first logic circuit comprises a plurality of respective sub-circuits, each of the sub-circuits having an equal number of digital AND gates.

5. An analog-to-digital converter as claimed in claim 1, wherein when the digital binary output signal comprises n bits, the first logic circuit comprises a plurality of respective sub-circuits, each of the sub-circuits having three digital AND gates.

6. An analog-to-digital converter as claimed in claim 1, wherein when the digital binary output signal comprises n bits, the number of bit changes in the columns of the matrix being 3,4,4,4.

7. An analog-to-digital converter as claimed in claim 1, wherein the number of bit changes in at least two of the columns of the matrix are equal.

8. An analog-to-digital converter as claimed in claim 1, wherein the number of bit changes in at least three of the columns of the matrix are equal.

9. An analog-to-digital converter as claimed in claim 1, wherein the number of bit changes in a majority of the columns of the matrix are equal.

10. An analog-to-digital converter as claimed in claim 1, wherein the number of bit changes in all but one of the columns of the matrix are equal.

11. An analog-to-digital converter as claimed in claim 10, wherein the number of bit changes in the column which is not equal to the number of bit changes in the other columns is one less than the number of bit changes in the other columns.

12. A method of generating a code comprising a set of bit words, the method comprising:

defining a set of bit words, each bit word containing n bits, where n>1 and where each bit word represents a unique value;

arranging the bit words into a set of nodes, each node representing one bit word;

making inter-node connections such that connections are only made between nodes of which the associated bit words differ by only one bit and connections are made between all adjacent nodes which differ by only one bit;

successively traversing all of the nodes by various paths via the connections thus made, a matrix being drafted for each path, the bit words of the successive nodes being accommodated in the matrix in consecutive rows; and selecting a matrix from the matrices thus drafted whose respective numbers of bit changes in the respective columns of the matrix are substantially equal.

13. A method as claimed in claim 12, wherein when the method is executed, a computer is used for traversing all the nodes via said created connections and for selecting at least one matrix whose respective numbers of bit changes in the respective columns of the matrix are substantially equal.

14. A method as claimed in claim 12, wherein n=4 to thereby provide 16 bit words.

15. A method as claimed in claim 14, wherein the inter-node connections are made such that each node is connected to four adjacent nodes.

16. A method as claimed in claim 12, wherein the inter-node connections are made such that each node is connected to n different adjacent nodes.

17. A method as claimed in claim 12, wherein a matrix is selected from the matrices thus drafted having at least two columns having the same number of bit changes.

18. A method as claimed in claim 12, wherein a matrix is selected from the matrices thus drafted having at least three columns having the same number of bit changes.

19. A method as claimed in claim 12, wherein a matrix is selected from the matrices thus drafted having a majority of columns having the same number of bit changes.

20. A method as claimed in claim 12, wherein n=4 and the selected matrix therefore has four columns, the number of bit changes in the columns of the matrix being 3,4,4,4.

* * * * *